(12) United States Patent
Han et al.

(10) Patent No.: US 9,947,769 B1
(45) Date of Patent: Apr. 17, 2018

(54) MULTIPLE-LAYER SPACERS FOR FIELD-EFFECT TRANSISTORS

(71) Applicant: GLOBALFOUNDRIES Inc., Grand Cayman (KY)

(72) Inventors: Tao Han, Clifton Park, NY (US); Zhenyu Hu, Clifton Park, NY (US); Jinping Liu, Ballston Lake, NY (US); Hsien-Ching Lo, Clifton Park, NY (US); Jianwei Peng, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/363,461

(22) Filed: Nov. 29, 2016

(51) Int. Cl.
*H01L 29/66* (2006.01)
*H01L 29/78* (2006.01)
*H01L 21/02* (2006.01)

(52) U.S. Cl.
CPC ...... *H01L 29/6656* (2013.01); *H01L 21/0214* (2013.01); *H01L 21/0228* (2013.01); *H01L 29/66795* (2013.01); *H01L 29/785* (2013.01)

(58) Field of Classification Search
CPC ........... H01L 29/6656; H01L 29/66689; H01L 29/66719; H01L 21/823864
See application file for complete search history.

(56) References Cited

U.S. PATENT DOCUMENTS

| | | | |
|---|---|---|---|
| 9,236,397 B2 | 1/2016 | Holt et al. | |
| 9,419,101 B1 | 8/2016 | Peng et al. | |
| 2011/0031538 A1* | 2/2011 | Hsieh | H01L 29/6656 257/288 |
| 2015/0279957 A1* | 10/2015 | Wang | H01L 29/66795 257/401 |
| 2016/0043197 A1* | 2/2016 | Kim | H01L 21/31116 438/283 |
| 2016/0141381 A1* | 5/2016 | Kim | H01L 29/66545 257/288 |

* cited by examiner

*Primary Examiner* — Joseph C Nicely
*Assistant Examiner* — Antonio Crite
(74) *Attorney, Agent, or Firm* — Thompson Hine LLP; Francois Pagette

(57) ABSTRACT

Structures for spacers in a device structure for a field-effect transistor and methods for forming spacers in a device structure for a field-effect transistor. A first spacer is located adjacent to a vertical sidewall of a gate electrode, a second spacer is located between the first spacer and the vertical sidewall of the gate electrode, and a third spacer is located between the second spacer and the vertical sidewall of the gate electrode. The first spacer has a higher dielectric constant than the second spacer. The first spacer has a higher dielectric constant than the third spacer. The third spacer has a lower dielectric constant than the second spacer.

9 Claims, 1 Drawing Sheet

MULTIPLE-LAYER SPACERS FOR FIELD-EFFECT TRANSISTORS

BACKGROUND

The present invention relates to semiconductor device fabrication and integrated circuits and, more specifically, to structures for spacers in a device structure for a field-effect transistor and methods for forming spacers in a device structure for a field-effect transistor.

Device structures for a field-effect transistor include a source, a drain, a channel situated between the source and drain, and a gate structure including a gate electrode and a gate dielectric separating the gate electrode from the channel. A gate voltage applied to the gate electrode is used to provide switching that selectively connects the source and drain to each other through the channel. The channel of a planar field-effect transistor is located beneath the top surface of the substrate on which the gate structure is supported.

A fin-type field-effect transistor (FinFET) is a type of field-effect transistor that is capable of being more densely packed in an integrated circuit than planar field-effect transistors. A FinFET may include a semiconductor fin, an gate electrode that overlaps a channel in the semiconductor fin, and heavily-doped source/drain regions formed in sections of the semiconductor fin peripheral to the gate structure. The channel of a FinFET is effectively elevated above the top surface of the substrate so that the gate structure can wrap about multiple sides of the channel. The wrapped-arrangement between the gate electrode and fin improves control of the channel and reduces the leakage current when the FinFET is in its 'off' state. This, in turn, enables the use of lower threshold voltages and results in better performance and power.

Spacers may be formed adjacent to the sidewalls of the gate electrode with properties intended to boost device performance. A bi-layer spacer includes an inner spacer proximate to the sidewalls and an outer spacer separated from the sidewalls by the inner spacer. The inner spacer may be selected to have a lower dielectric constant than the outer spacer, which tends to boost circuit speed but also tends to reduce its robustness. The outer spacer may be selected to resist processes that can cause spacer erosion and to thereby protect the inner spacer against erosion. For example, the etch rate of the outer spacer may be several times lower than the etch rate of the inner spacer when exposed to, for example, dilute hydrofluoric acid. If the protection afforded by the outer spacer fails, the inner spacer can erode and lead to the formation of a void that links the gate electrode and the source/drain region normally separated from the gate electrode by the bi-layer spacer.

Improved structures for spacers in a device structure for a field-effect transistor and methods for forming spacers in a device structure for a field-effect transistor are needed.

SUMMARY

In an embodiment of the invention, a structure includes a gate electrode having a vertical sidewall, a first spacer adjacent to the vertical sidewall of the gate electrode, a second spacer located between the first spacer and the vertical sidewall of the gate electrode, and a third spacer located between the second spacer and the vertical sidewall of the gate electrode. The first spacer has a higher dielectric constant than the second spacer. The first spacer has a higher dielectric constant than the third spacer. The third spacer has a lower dielectric constant than the second spacer.

In an embodiment of the invention, a method includes forming a first spacer comprised of silicon oxycarbonitride (SiOCN) on a gate electrode by an atomic layer deposition process. The atomic layer deposition process includes adsorbing silicon on a surface of the gate electrode, adsorbing oxygen on the surface of the gate electrode, and, adsorbing carbon and nitrogen on the surface of the gate electrode after the oxygen is adsorbed on the surface of the gate electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
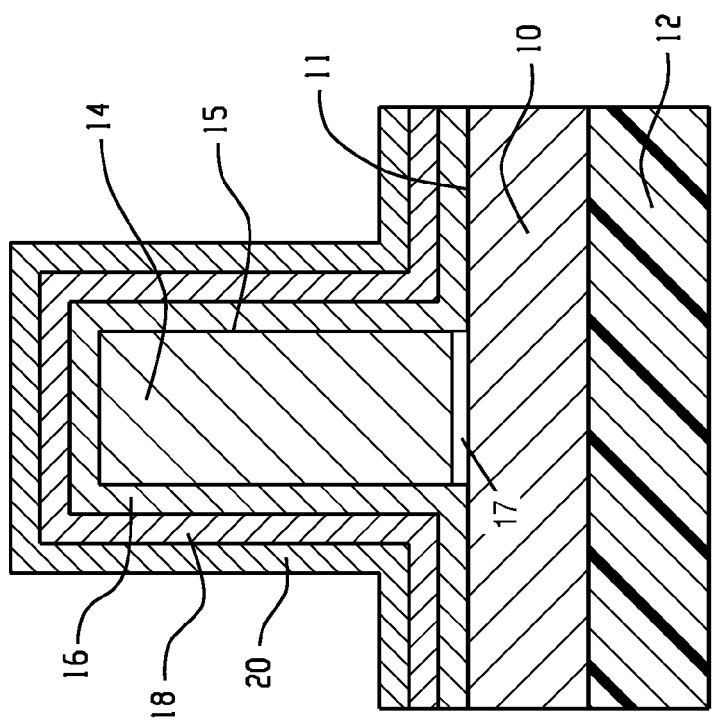
FIG. 1 is a cross-sectional view of a device structure at an initial stage of a processing method in accordance with embodiments of the invention.

With reference to FIG. 1 and in accordance with embodiments of the invention, a fin 10 is formed on a substrate 12. The fin 10 may be formed from the semiconductor material of the substrate 12 by photolithography and etching processes, such as a sidewall imaging transfer (SIT) process that promotes dense packing. The substrate 12 may be a bulk substrate or a device layer of a semiconductor-on-insulator (SOI) substrate. The fin 10 may be used to fabricate a fin-type field-effect transistor (FinFET).

A gate electrode 14 projects vertically from a plane at the top surface of the fin 10 and overlaps with the fin 10. The gate electrode 14 overlaps a central region of the fin 10 and a gate dielectric 17 is disposed between the gate electrode 14 and the fin 10. The gate electrode 14 may be a dummy gate electrode composed of a semiconductor material, such as polysilicon deposited by chemical vapor deposition (CVD), and the gate dielectric 17 may be composed of a dielectric material, such as silicon dioxide ($SiO_2$), deposited by CVD. Alternatively, the gate electrode 14 may be a functional gate electrode composed of a metal, such as aluminum or tungsten, deposited by physical vapor deposition (PVD) or CVD, and may further include a work function metal layer for adjusting the threshold voltage. The gate dielectric 17 of the functional gate structure may be comprised of an electrically-insulating material, such as a high-k dielectric material such as hafnium oxide or hafnium oxynitride, silicon dioxide, silicon oxynitride, or layered combinations of these dielectric materials, deposited by CVD or ALD. In a replacement metal gate process, a dummy gate electrode may be removed and replaced by a functional gate electrode and gate dielectric following spacer formation as subsequently described.

In an alternative embodiment, the gate electrode 14 and the substrate 12 may be processed to form a planar field-effect transistor instead of a FinFET. The gate electrode 14 of the planar field-effect transistor may be formed on and project from the top surface of the substrate 12, which will coincide in location with the top surface 11 in FIG. 1, instead of in conjunction with the fin 10. The gate electrode 14 is separated from the top surface of the substrate 12 by the gate dielectric 17.

Conformal layers 16, 18, 20 are serially deposited that cover the vertical sidewalls 15 and top surface of the gate electrode 14 and the top surface 11 of the fin 10. The conformal layers 16, 18, 20 may be formed by an atomic layer deposition (ALD) process in which the deposition of each atomic layer of spacer material, or a fraction thereof, is controlled by alternating and sequential introduction of appropriate gas phase reactants that react in a self-limiting manner to incrementally form or build the conformal layers 16, 18, 20. The conformal layers 16, 18, 20 conform to the non-planar topography arising from the gate electrode 14 and the deposited films have a thickness that is constant regardless of the feature geometry of the underlying gate electrode 14 and fin 10. The inner conformal layer 16 is deposited before the center conformal layer 18 and the outer conformal layer 20, and the central conformal layer 18 is deposited before the outer conformal layer 20. Each of the conformal layers 16, 18, 20 may be composed of a thin film of silicon oxycarbonitride (SiOCN) in which the composition is engineered (i.e., tailored) to provide a specific value for the material dielectric constant (i.e., permittivity or k).

Figure 2:
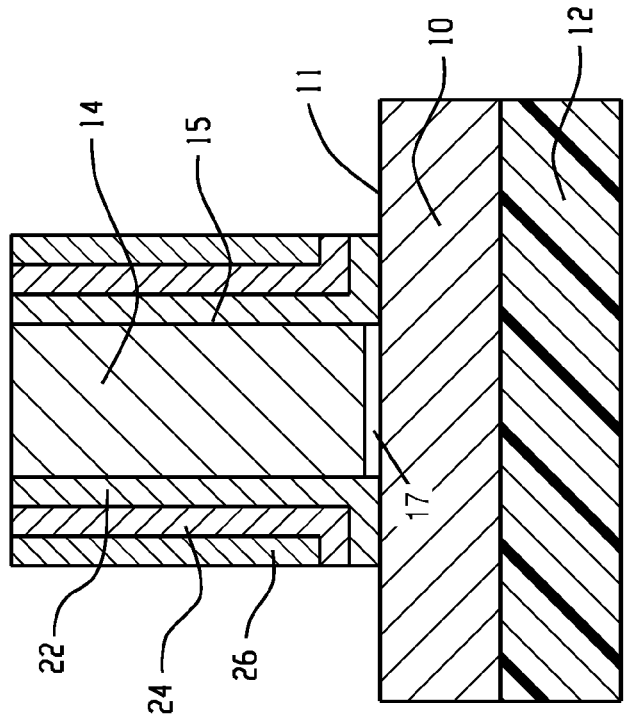
FIG. 2 is a cross-sectional view of the device structure of FIG. 1 at a subsequent stage of the processing method.

With reference to FIG. 2 in which like reference numerals refer to like features in FIG. 1 and at a subsequent fabrication stage, the conformal layers 16, 18, 20 may be shaped with an anisotropic etching process, such as reactive ion etching (RIE), that preferentially removes the dielectric material from horizontal surfaces, such as the top surface 11 of the fin 10 and the top surface of the gate electrode 14. The etch chemistry for the etching process removes the conformal layers 16, 18, 20 selective to the materials constituting the fin 10 and gate electrode 14. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The sections of the conformal layers 16, 18, 20 remaining on the vertical sidewalls of the gate electrode 14 respectively define spacers 22, 24, 26.

With continued reference to FIGS. 1 and 2, the conformal layers 16, 18, 20 from which the spacers 22, 24, 26 are formed may be deposited by ALD using different deposition process conditions in order to provide targeted properties, such as dielectric constant, thickness, and etch resistance. In an embodiment, the center spacer 24 formed from conformal layer 18 may have a larger thickness than either the inner spacer 22 formed from conformal layer 16 or the outer spacer 26 formed from conformal layer 20.

The conformal layer 16 used to form the inner spacer 22 may be formed by ALD using a multiple-step sequence in which the gas phase reactants are cyclically introduced in a specific order and with specific deposition conditions. The ALD deposition is performed in a reaction chamber that is coupled with gas sources providing the gas phase reactants, a purge gas source of an inert gas (e.g., Argon (Ar) or Nitrogen ($N_2$)), and a vacuum source. Prior to initiating the cyclic deposition process, the reaction chamber may be initially evacuated and/or purged, and the substrate 12 may be heated to a given process temperature, such as a temperature in a range of 550° C. to 680° C.

In an initial step of the cyclic process, the gas phase reactant introduced into the ALD reaction chamber is a silicon-containing precursor, such as the inorganic compound hexachlorodisilane ($Si_2Cl_6$). The silicon-containing precursor is flowed for a given flow time and at a given flow rate, and permitted to adsorb on the exterior surface of the gate electrode 14. In embodiments, the flow rate may 100 sccm to 500 sccm, the chamber pressure may be 100 mTorr to 500 mTorr, and the flow time may be 10 seconds to 30 seconds. The amount of silicon that adsorbs on the exterior surface of the gate electrode 14 is dependent, among other deposition conditions, upon the flow rate and flow time as parameters. The adsorbed layer may range in thickness from about 0.1 nm to about 0.3 nm. The reaction chamber is evacuated using the vacuum source and purged by a flow of the purge gas to clear the silicon-containing precursor from the reaction chamber in anticipation of the next step of the cyclic process.

In a subsequent step of the cyclic process, the gas phase reactant that is introduced into the ALD reaction chamber is a precursor containing nitrogen (N) and carbon (C). The nitrogen- and carbon-containing precursor is flowed for a given flow time and at a given flow rate, and permitted to adsorb on the exterior surface of the gate electrode 14 and combine with the adsorbed silicon. In embodiments, the flow rate may be 300 sccm to 800 sccm, the chamber pressure may be 100 mTorr to 500 mTorr, and the flow time may be 10 seconds to 30 seconds. The amount of carbon and nitrogen that adsorbs on the exterior surface of the gate electrode 14 is dependent, among other deposition conditions, upon the flow rate and flow time as parameters. The adsorbed layer may range in thickness from about 0.1 nm to about 0.3 nm. The reaction chamber is evacuated using the vacuum source and purged by a flow of the purge gas to clear the nitrogen- and carbon-containing precursor from the reaction chamber.

In a subsequent step of the cyclic process, the gas phase reactant that is introduced into the ALD reaction chamber is an oxygen-containing precursor, such as oxygen ($O_2$). The oxygen-containing precursor is flowed for a given flow time and at a given flow rate, and permitted to adsorb on the exterior surface of the gate electrode 14 and combine with the adsorbed silicon. In embodiments, the flow rate may be 3.0 slm to 6.0 slm, the chamber pressure may be 1 Torr to 10 Torr, and the flow time may be 8 seconds to 40 seconds. The amount of oxygen that adsorbs on the exterior surface of the gate electrode 14 is dependent, among other deposition conditions, upon the flow rate and flow time as parameters. The adsorbed layer may range in thickness from about 0.1 nm to about 0.3 nm. The reaction chamber is evacuated using the vacuum source and purged by a flow of the purge gas to clear the oxygen-containing precursor from the reaction chamber.

The cyclic process of sequentially introducing the different precursors is repeated to increase of the thickness of the conformal layer and to eventually deposit the conformal layer 16 with a given final thickness. For example, the final thickness of the conformal layer 16 (and spacer 22) may range from 0.5 nm to 5 nm. In embodiments, the SiOCN material comprising the conformal layer 16 may have a silicon content of 30 atomic percent to 35 atomic percent, an oxygen content of 38 atomic percent to 62 atomic percent, a carbon content of 1 atomic percent to 18 atomic percent, and a nitrogen content of 10 atomic percent to 16 atomic percent.

After the conformal layer 16 is formed, the conformal layer 18 used to form the center spacer 24 may be formed using a multiple-step sequence in which the gas phase reactants are cyclically introduced in a specific order and with specific deposition conditions. Prior to initiating the cyclic deposition process, the reaction chamber may be initially evacuated and/or purged, and the substrate 12 may be heated to a given temperature, such as a temperature in a range of 550° C. to 680° C.

In an initial step of the cyclic process, the gas phase reactant introduced into the ALD reaction chamber is the silicon-containing precursor, such as the inorganic compound hexachlorodisilane ($Si_2Cl_6$). The silicon-containing precursor is flowed for a given flow time and at a given flow rate, and permitted to adsorb on the exterior surface of the conformal layer 16 on the gate electrode 14. In embodiments, the flow rate may be 100 sccm to 400 sccm, the chamber pressure may be 100 mTorr to 1000 mTorr, and the flow time may be 10 seconds to 30 seconds. The amount of silicon that adsorbs on the exterior surface of the conformal layer 16 on the gate electrode 14 is dependent, among other deposition conditions, upon the flow rate and flow time as parameters. The adsorbed layer may range in thickness from about 0.1 nm to about 0.3 nm. The reaction chamber is evacuated using the vacuum source and purged by a flow of the purge gas to clear the silicon-containing precursor from the reaction chamber in anticipation of the next step of the cyclic process.

In a subsequent step of the cyclic process, the gas phase reactant that is introduced into the ALD reaction chamber is an oxygen-containing precursor, such as oxygen ($O_2$). The oxygen-containing precursor is flowed for a given flow time and at a given flow rate, and permitted to adsorb on the exterior surface of the conformal layer 16 on the gate electrode 14 and combine with the adsorbed silicon. In embodiments, the flow rate may be 3000 sccm to 6000 sccm, the chamber pressure may be 1 Torr to 10 Torr, and the flow time may be 5 seconds to 40 seconds. The amount of adsorbed oxygen is dependent, among other deposition conditions, upon the flow rate and flow time as parameters. The adsorbed layer may range in thickness from about 0.1 nm to about 0.3 nm. The reaction chamber is evacuated using the vacuum source and purged by a flow of the purge gas to clear the oxygen-containing precursor from the reaction chamber.

In a subsequent step of the cyclic process, the gas phase reactant that is introduced into the ALD reaction chamber is a precursor containing nitrogen (N) and carbon (C). The nitrogen- and carbon-containing precursor is flowed for a given flow time and at a given flow rate, and permitted to adsorb on the exterior surface of the conformal layer 16 on the gate electrode 14 and combine with the adsorbed silicon and oxygen. In embodiments, the flow rate may be 300 sccm to 800 sccm, the chamber pressure may be 100 mTorr to 2000 mTorr, and the flow time may be 10 seconds to 40 seconds. The amount of adsorbed carbon and nitrogen is dependent, among other deposition conditions, upon the flow rate and flow time as parameters. The adsorbed layer may range in thickness from about 0.1 nm to about 0.3 nm. The reaction chamber is evacuated using the vacuum source and purged by a flow of the purge gas to clear the nitrogen- and carbon-containing precursor from the reaction chamber.

The cyclic process of sequentially introducing the different precursors is repeated to increase of the thickness of the conformal layer and to eventually deposit the conformal layer 18 with a given final thickness. For example, the final thickness of the conformal layer 18 (and spacer 24) may range from 7 nm to 12 nm. In embodiments, the SiOCN material comprising the conformal layer 18 may have a silicon content of 31 atomic percent to 34 atomic percent, an oxygen content of 44 atomic percent to 50 atomic percent, a carbon content of 1 atomic percent to 8 atomic percent, and a nitrogen content of 10 atomic percent to 14 atomic percent.

The carbon content of the conformal layer 18 and spacer 24 may be increased in comparison with the carbon content of the conventional conformal layer and spacer, while the dielectric constant of the conformal layer 18 and spacer 24 may be comparable to or less than the dielectric constant of the conventional conformal layer and spacer. The dielectric constant of conformal layer 18 and spacer 24 is less than the dielectric constant of conformal layer 16 and spacer 22. However, the conformal layer 16 has an lower etch rate than conformal layer 18 when exposed to an etchant, such as a solution containing hydrofluoric acid or ammonia, or during a chemical oxide removal process.

Flowing the oxygen-containing precursor into the ALD reaction chamber before the nitrogen- and carbon-containing precursor and with control over the deposition conditions may be used to promote the generation of oxygen-to-silicon bonds with preference to the formation of carbon-to-silicon bonds and nitrogen-to-silicon bonds. In particular, the conformal layer 18 includes a higher percentage of oxygen in its composition than the conformal layer 16, which may be accomplished by lengthening the flow time for an equal flow rate. For example, the flow time at the same flow rate used to form the conformal layer 18 may be a factor of two (2) greater than the flow time used to form the conformal layer 16.

In an embodiment, the conformal layer 16 and spacer 22 may have a lower atomic percentage of oxygen than the conformal layer 18 and spacer 24. In an embodiment, the conformal layer 16 and spacer 22 may have a higher atomic percentage of carbon than the conformal layer 18 and spacer 24. In an embodiment, both of the conditions on carbon content and oxygen content may exist.

After the conformal layers 16 and 18 are formed, the conformal layer 20 used to form the outer spacer 26 may be formed using a multiple-step sequence in which the gas phase reactants are cyclically introduced in a specific order and with specific deposition conditions. Prior to initiating the cyclic deposition process, the reaction chamber may be initially evacuated and/or purged, and the substrate 12 may be heated to a given temperature, such as a temperature in a range of 550° C. to 680° C.

In an initial step of the cyclic process, the silicon-containing precursor is initially introduced into the ALD reaction chamber as a gas phase reactant. In embodiments, the flow rate may be 100 sccm to 400 sccm, the chamber pressure may be 500 mTorr to 2000 mTorr, and the flow time may be 10 seconds to 20 seconds. After the adsorbed layer is formed, the reaction chamber is evacuated using the vacuum source and purged by a flow of the purge gas to clear the silicon-containing precursor from the reaction chamber in anticipation of the next step of the cyclic process.

In a subsequent step of the cyclic process, a carbon-containing precursor is introduced into the ALD reaction chamber as a gas phase reactant. In embodiments, the flow rate may be 500 sccm to 5000 sccm, the chamber pressure may be 5 Torr to 40 Torr, and the flow time may be 10 seconds to 120 seconds. After the adsorbed layer is formed, the reaction chamber is evacuated using the vacuum source and purged by a flow of the purge gas to clear the carbon-containing precursor from the reaction chamber in anticipation of the next step of the cyclic process.

In a subsequent step of the cyclic process, the oxygen-containing precursor is introduced into the ALD reaction chamber as a gas phase reactant. In embodiments, the flow rate may be 4000 sccm to 6000 sccm, the chamber pressure may be 5 Torr to 10 Torr, and the flow time may be 10 seconds to 20 seconds. After the adsorbed layer is formed, the reaction chamber is evacuated using the vacuum source and purged by a flow of the purge gas to clear the oxygen-containing precursor from the reaction chamber in anticipation of the next step of the cyclic process.

In a subsequent step of the cyclic process, a nitrogen-containing precursor is introduced into the ALD reaction chamber as a gas phase reactant. In embodiments, the flow rate may be 4000 sccm to 5000 sccm, the chamber pressure may be 5 Torr to 10 Torr, and the flow time may be 10 seconds to 20 seconds. After the adsorbed layer is formed, the reaction chamber is evacuated using the vacuum source and purged by a flow of the purge gas to clear the nitrogen-containing precursor from the reaction chamber in anticipation of the next step of the cyclic process.

The cyclic process of sequentially introducing the different precursors is repeated to increase the thickness of the conformal layer and to eventually deposit the conformal layer 20 with a given final thickness. For example, the final thickness of the conformal layer 20 (and spacer 26) may range from 1.0 nm to 4 nm. In embodiments, the SiOCN material comprising the conformal layer 20 may have a silicon content of 36 atomic percent to 40 atomic percent, an oxygen content of 29 atomic percent to 33 atomic percent, a carbon content of 8 atomic percent to 10 atomic percent, and a nitrogen content of 23 atomic percent to 26 atomic percent. The dielectric constant of conformal layer 20 is greater than the dielectric constant of conformal layer 16 and the dielectric constant of conformal layer 18.

In an embodiment, two or more of the conformal layers 16, 18, 20 may be deposited in situ inside of a single ALD deposition tool with variations in the process conditions used to tailor the film properties (e.g., composition). The wafer may be loaded onto a boat and placed inside the ALD reaction chamber. The temperature is ramped up to the targeted process temperature, and the conformal layers 16, 18, 20 are serially deposited with different process conditions. The temperature is ramped downward, and the boat is removed from the ALD reaction chamber. This process flow may vary from conventional processes in which multiple tools are required to deposit the different conformal layers due to extreme differences in composition that are needed.

With reference to Tables 1 and 2, the following example illustrates the properties and composition of SiOCN forming the spacers 22, 24 formed in accordance with an exemplary embodiment in comparison with the properties and composition of a conventional inner spacer formed of SiOCN and that would be replaced by the combination of the exemplary inner spacer 22 and exemplary center spacer 24. The cyclic ALD process forming the conventional inner spacer introduced a carbon-containing precursor before the oxygen-containing precursor and a separate nitrogen-containing precursor after the oxygen-containing precursor. The growth conditions for the spacers are given in Table 1.

TABLE 1

| Items Sequence Elements | Parameters | Conventional Inner Spacer Si -> C -> O -> N | Inner Spacer Si -> C/N -> O | Center Spacer Si -> O -> C/N |
|---|---|---|---|---|
| Temperature | ° C. | 600 | 630 | 630 |
| Thickness | nm | 9.0 | 1.0 | 9.0 |
| Si | Time (s) | 12 | 12 | 12 |
|  | Flow (sccm) | 100 | 200 | 200 |
|  | Pressure (mTorr) | 1000 | 1000 | 1000 |
| O | Time (s) | 14 | 17 | 24 |
|  | Flow (slm) | 5 | 3 | 5 |
|  | Pressure (Torr) | 9 | 9 | 9 |

TABLE 1-continued

| Items Sequence Elements | Parameters | Conventional Inner Spacer Si -> C -> O -> N | Inner Spacer Si -> C/N -> O | Center Spacer Si -> O -> C/N |
|---|---|---|---|---|
| C or C/N | Time (s) | 18/30 | 15 | 12 |
|  | Flow (sccm) | 5000/500 | 500 | 500 |
|  | Pressure (Torr) | 35/7 | 7 | 7 |
| N | Time (s) | 18 |  |  |
|  | Flow (slm) | 4.5 |  |  |
|  | Pressure (Torr) | 7 |  |  |

The dielectric constant of the spacers of Table 1 was measured by Hg-Probe measurement. The measured dielectric contacts are tabulated in Table 2.

TABLE 2

|  | Dielectric Constant | Carbon (At. %) | Nitrogen (At. %) | Oxygen (At. %) | Silicon (At. %) |
|---|---|---|---|---|---|
| Conventional Inner Spacer | 4.6 | 1.9 | 18.9 | 41.4 | 37.8 |
| Inner Spacer | 4.5 | 14 | 13 | 41 | 32 |
| Center Spacer | 4.3 | 8.3 | 12.8 | 46.2 | 32.7 |

With reference to Table 3, the robustness of the spacers in Tables 1 and 2 was measured for exposure to different etchants commonly used in cleaning processes associated with the formation of a FinFET and under equivalent conditions. For a given exposure time, the removed spacer thickness was determined and used to calculate an etch rate.

TABLE 3

|  | Etch Rate in dilute Hydrofluoric Acid (Angstroms per minute) | Etch Rate during Chemical Oxide Removal (Angstroms per minute) | Etch Rate in Ammonia (Angstroms per minute) |
|---|---|---|---|
| Conventional Inner Spacer | 21.9 | 15.5 | 17.9 |
| Inner Spacer | 2.5 | 5.1 | 7.9 |
| Center Spacer | 10.7 | 10.3 | 15.5 |

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is clamied is:

1. A structure comprising:
   a gate electrode having a vertical sidewall;
   a first spacer adjacent to the vertical sidewall of the gate electrode;
   a second spacer located between the first spacer and the vertical sidewall of the gate electrode; and
   a third spacer located between the second spacer and the vertical sidewall of the gate electrode,
   wherein the first spacer, the second spacer, and the third spacer are composed of silicon oxycarbonitride, the first spacer has a higher dielectric constant than the second spacer, the first spacer has a higher dielectric constant than the third spacer, and the third spacer has a lower dielectric constant than the second spacer, and the third spacer has a composition of the silicon oxycarbonitride with a lower etch rate when exposed to ammonia than the silicon oxycarbonitride of the second spacer.

2. The structure of claim 1 further comprising:
   a semiconductor fin, wherein the gate electrode overlaps with the semiconductor fin.

3. The structure of claim 1 wherein the third spacer includes a higher atomic percentage of carbon than the second spacer.

4. The structure of claim 1 wherein the first spacer includes a lower atomic percentage of oxygen than the second spacer, and the first spacer includes a lower atomic percentage of oxygen than the third spacer.

5. The structure of claim 1 wherein the third spacer has a composition of the silicon oxycarbonitride with a lower etch rate when exposed to dilute hydrofluoric acid than the silicon oxycarbonitride of the second spacer.

6. The structure of claim 1 wherein the third spacer includes a lower atomic percentage of oxygen than the second spacer.

7. The structure of claim 6 wherein the third spacer includes a higher atomic percentage of carbon than the second spacer.

8. A structure comprising:
   a gate electrode having a vertical sidewall;
   a first spacer adjacent to the vertical sidewall of the gate electrode;
   a second spacer located between the first spacer and the vertical sidewall of the gate electrode; and
   a third spacer located between the second spacer and the vertical sidewall of the gate electrode,
   wherein the first spacer, the second spacer, and the third spacer are composed of silicon oxycarbonitride, the first spacer has a higher dielectric constant than the second spacer, the first spacer has a higher dielectric constant than the third spacer, and the third spacer has a lower dielectric constant than the second spacer, and the third spacer has a composition of the silicon oxycarbonitride with a lower etch rate during chemical oxide removal than the silicon oxycarbonitride of the second spacer.

9. The structure of claim 8 wherein the first spacer includes a lower atomic percentage of oxygen than the second spacer, and the first spacer includes a lower atomic percentage of oxygen than the third spacer.

* * * * *